United States Patent
Hartman

(10) Patent No.: US 11,245,043 B2
(45) Date of Patent: Feb. 8, 2022

(54) PARTICULATE ADHERENCE AND TEMPERATURE REDUCING COATING FOR PHOTOVOLTAIC SOLAR PANELS

(71) Applicant: James Hartman, LaQuinta, CA (US)

(72) Inventor: James Hartman, LaQuinta, CA (US)

( * ) Notice: Subject to any disclaimer, the term of this patent is extended or adjusted under 35 U.S.C. 154(b) by 0 days.

(21) Appl. No.: 16/410,824

(22) Filed: May 13, 2019

(65) Prior Publication Data
US 2020/0135941 A1    Apr. 30, 2020

Related U.S. Application Data

(60) Provisional application No. 62/670,592, filed on May 11, 2018.

(51) Int. Cl.
| | |
|---|---|
| *H01L 31/18* | (2006.01) |
| *H01L 31/0216* | (2014.01) |
| *C09D 183/04* | (2006.01) |
| *G02B 1/18* | (2015.01) |

(52) U.S. Cl.
CPC ...... *H01L 31/02167* (2013.01); *C09D 183/04* (2013.01); *H01L 31/186* (2013.01); *G02B 1/18* (2015.01)

(58) Field of Classification Search
CPC .................................................. H01L 31/02167
See application file for complete search history.

(56) References Cited

U.S. PATENT DOCUMENTS

| | | | |
|---|---|---|---|
| 2015/0037570 A1* | 2/2015 | Brophy | H01L 31/022466 428/336 |
| 2020/0207992 A1* | 7/2020 | Jana | C09D 183/06 |

* cited by examiner

*Primary Examiner* — Austin Murata
(74) *Attorney, Agent, or Firm* — Donn K. Harms

(57) ABSTRACT

An inorganic coating mixture for a solar panel which cures to a protective layer upon the exposed surface of the transparent sheet of material covering a photovoltaic cell of a solar panel and a method therefor. The protective layer, so formed, reduces the operating temperature of the solar panel and deters the adherence of dust and other particulate matter to the exposed surface of the transparent sheet.

2 Claims, 1 Drawing Sheet

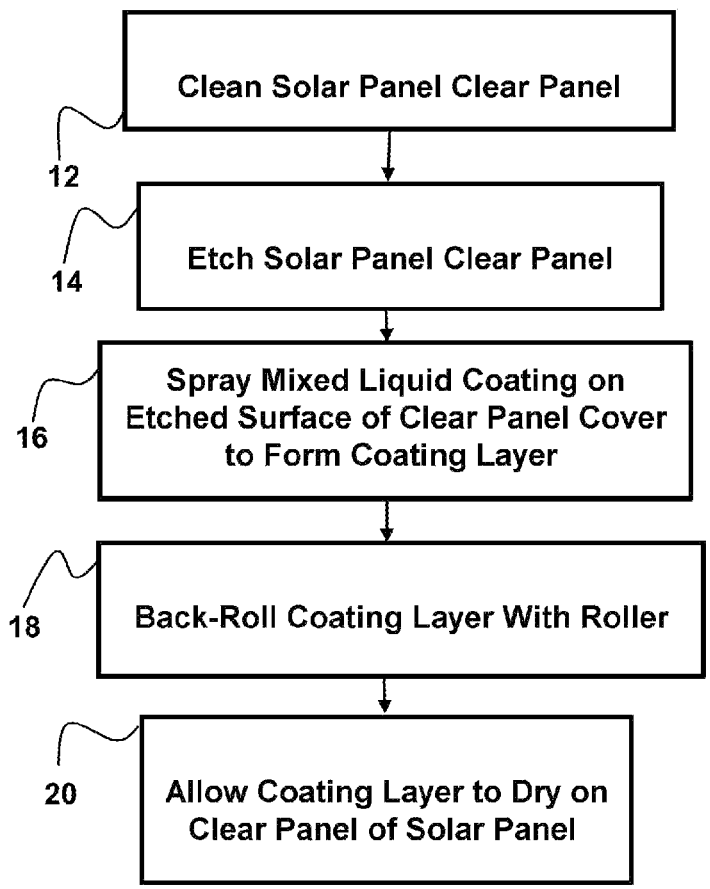

Inorganic Liquid Coating Ingredients
Curable to Form Layer on Solar Panel - Weight by Volume a) Inorganic Siloxane liquid coating material curable to form a layer on a solar panel, which contains:
an alkoxysilane mixture including 98 percent alkoxysilanes mixed with 2 percent solvent, and a curable carrier material, where the alkoxysilane mixture comprises 59-61% of the total weight of the inorganic liquid coating.

b) Inorganic Siloxane liquid coating curable to form a layer on a solar panel which contains:
1) 59-61% by total mixture weight of an alkoxysilane mixture formed of 98 percent alkoxysilanes mixed with 2 percent methyl alcohol; and
2) 25-28% of acetic acid by weight of the total coating mixture weight; and
3) 12-14% of a glycol mix by weight of the total coating mixture weight.

FIG. 1

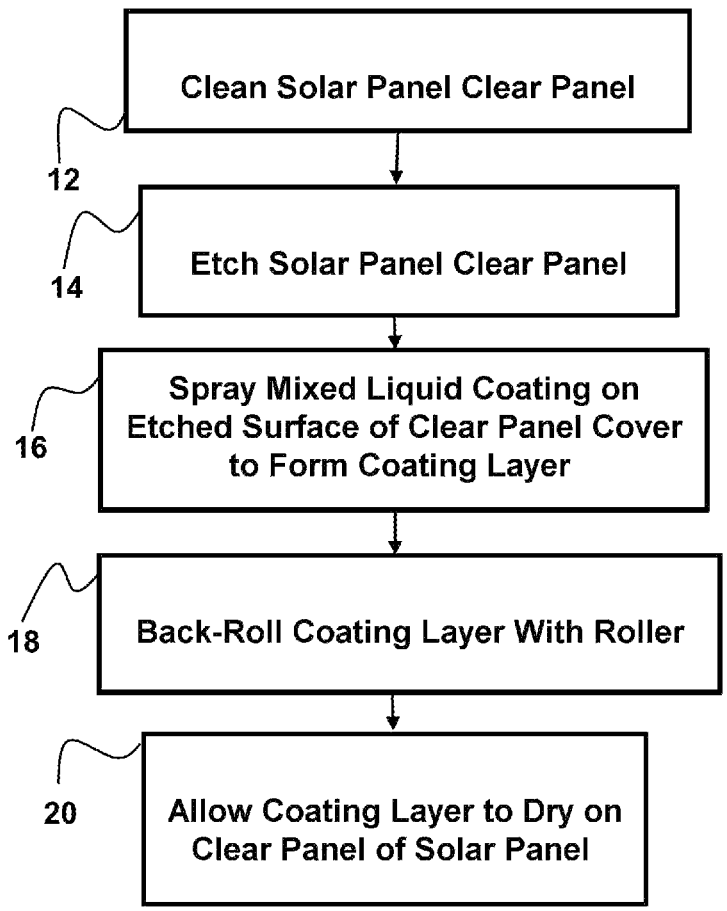

FIG. 2

PARTICULATE ADHERENCE AND TEMPERATURE REDUCING COATING FOR PHOTOVOLTAIC SOLAR PANELS

This application claims priority to U.S. Provisional Patent Application Ser. No. 62/670,592, filed on May 11, 2018, which is incorporated herein in its entirety by this reference thereto.

BACKGROUND OF THE INVENTION

1. Field of the Invention

The present invention relates generally to photovoltaic solar panels. More particularly, it relates to a system including a coating material layer and method for applying the coating layer on photovoltaic solar panels during manufacture or after installation. With the coating layer adhered to surfaces of such solar panels, it inhibits the adherence of dust, dirt, snow, and other particulate to the solar panel. Concurrently, the coating layer causes an ongoing lowering of the operating temperature of the solar panel to which the coating layer is adhered.

2. Prior Art

Photovoltaic solar panels in recent years have become more efficient at the generation of electricity from sunlight. Also in recent years, the deployment of very large solar farms to generate electricity for the power grid have become ever more common. Solar panels, whether used singularly on a small scale or employed by the thousands which occupy acres in huge solar farms, are conventionally positioned to face the sun at a pitched angle that conventionally depends on their geographic latitude in order to place each panel at the optimum pitch angle for the reception of sunlight to best generate electricity.

Even with the advent of ever more efficient photovoltaic solar panels a significant reduction in electrical energy occurs when dust, dirt, debris, snow, and other particulate contacts and adheres to the face of the clear sheet which covers the underlying array of photovoltaic solar cells which are positioned on such a solar panel. Any buildup of particulate matter, be it dust, dirt, or snow, has a significant impact on the output efficiency of an individual solar panel.

It is well known that such accumulations of particulate on the clear surface of solar panels can easily result in a five to fifteen percent reduction in electricity. Where such solar panels are positioned in a huge grid of many thousands of solar panels, even a very thin coating of such particulate to the clear surface covering the plurality of photovoltaic cells which is on the lower end of the noted power loss percentage will result in a huge decrease in power output and a significant loss in revenue due to decreased electrical power sales to the power company supplying the power grid.

Recognizing this problem, the solar power industry continues in attempts and actions to remove accumulated particulate from solar panels. In the huge solar farms which can cover many acres with thousands of such solar panels, removal of particulate such as dust and snow is a constant, ongoing, and expensive proposition. For example, companies operating large solar farms now continually have services or automatic machinery which wash the solar panels to remove particulate and subsequently must rinse the washed panels and then dry them in a manner to avoid streaks and shadows which would result in lost sunlight transmission to the underlying photovoltaic cells.

As can be discerned, such an ongoing cleaning process is expensive in labor and equipment costs, and can be instantly overcome by a single dust storm or snow storm. Further, in areas of the country where such solar panels or solar farms are in a cold climate, once the air temperature lowers below freezing, the cleaning of such solar panels is prevented lest the fluid used to wash each panel freeze onto the panel itself. Further, in areas of the globe where the latitude dictates the tilt angle of such solar panels to be substantially horizontally disposed, the particulate build-up can be significantly higher due to the low tilt, and cleaning with fluid is made much harder since the washing and rinsing fluids do not easily drain from the clear panel covering quickly.

The coating layer herein and method therefor provides a protective coating layer which is employable for new and more particularly, for existing solar panels such as those in large numbers in solar farms. Once applied using the coating material and method herein, the cured coating layer significantly resists the adherence of particulate to the clear panel covering the plurality of photovoltaic cells in a solar panel. As a consequence, once the coating layer herein is adhered and cured to the transparent sheet of the solar panel, particulate such as dust and dirt do not easily achieve adherence and therefor fall from contact with the solar panels or are blown therefrom by wind or the like. Further, in the case of snow, the inability to adhere to the clear panel of such panels causes such snow to more easily and frequently fall therefrom subsequent to contact with the panel. Still further, and in a significant provision of utility, the coating layer herein, has been found to reduce the operating temperature of solar panels which when conventionally deployed in a solar farm in a hot or desert climate. As applied using the coating material and method herein, the cured resulting coating layer can provide an increase in electric power output from the resulting lowered operating temperature.

The forgoing examples of related art in the field of photovoltaic solar panels and the limitations related therewith are intended to be illustrative and not exclusive, and they do not imply any limitations on the coating and method for preventing particulate adherence described and claimed herein. Various limitations of the related art are already known or will become apparent to those skilled in the art upon a reading and understanding of the specification below and the accompanying drawings.

An object of the present invention is to provide a method and a coating material for application to new and existing photovoltaic solar panels which will cure to a coating layer which will significantly prevent the adherence of dust, dirt, snow, and other particulate matter to the surface of the solar panel.

It is an additional object of this invention to provide such a coating layer for photovoltaic solar panels which will not impede or impact the electrical energy production of such solar panels to which it is adhering.

It is yet an additional object of this invention to increase the overall efficiency of arrays of photovoltaic solar panels by significantly reducing the accumulating particulate on such panels which reduces electrical power production.

It is another object of the invention to provide such a coating material and method of forming a coating layer, which will reduce the operating temperature of such photovoltaic solar panels and enhance energy production therefrom.

SUMMARY OF THE INVENTION

Conventional solar panels are formed by a plurality of photovoltaic cells which are operatively electrically connected and positioned within a frame used to mount the solar panel at an optimum pitch angle. On the facing side of the solar panel frame which faces toward the sun, to protect the underlying photovoltaic cells and electrical connections in the panel, there is conventionally positioned a substantially transparent sheet of material. Such material is positioned to protect the underlying photovoltaic cells from moisture, hail, and other fluid or impact hazards which can easily harm or destroy the photovoltaic cells within the panel.

A number of clear sheet materials are conventionally employed which include for example, glass, polycarbonate, or another thin and substantially transparent materials which will protect the photovoltaic cells but not inhibit sunlight transmission to them. Maximizing the clarity of the clear sheet material and the exposed facing surface which faces the sun, is imperative to thereby maximize the electricity output by each of the array of photovoltaic cells positioned in the solar panel the clear sheet covers and protects.

The present invention, once applied, forms a currently preferred inorganic siloxane coating layer, or an inorganic polymeric siloxane coating layer once cured upon the surface of the clear material covering the photovoltaic cells. The coating material once cured adheres to the exterior facing surface of the transparent sheet of material covering the array of photovoltaic cells operatively positioned within a solar panel.

By inorganic siloxane coating material which cures to the coating layer herein, is meant a mixture of methyl alcohol, acetic acid and assorted glycol ethers forming a curable carrier containing alkoxysilanes. By inorganic polymeric siloxane coating material, is meant any polymeric materials employed as a curable carrier which will cure and form a coating layer having a polymer matrix containing alkoxysilanes, without the presence of carbon within the polymer.

The mixed coating material herein may be applied to the clear sheet during manufacture of a solar panel, or it can be applied to the clear material covering photovoltaic cells in existing solar panels which are deployed and operational either singularly, or in large solar farms which can include thousands of such solar panels.

The most preferred coating material based on experiment and test results, is an inorganic coating material mixture having a main component comprising an alkoxysilane mixture, which is disbursed in the rest of the coating material or carrier material which acts as a curable carrier. The coating material mixture herein, once sprayed upon the solar panel, and cured to a thin coating layer or substrate, will have the alkoxysilane mixture dispersed substantially evenly within solid solution forming the cured coating layer of coating material.

Currently based on testing and experimentation results, a preferred alkoxysilane mixture of alkoxysilanes and alcohol is combined into the coating material mixture, at a rate of 59-61% by weight relative to the total weight of the volume of the coating material mixture formed. As noted, the alkoxysilane-containing coating mixture includes an inorganic curable carrier material. The curable carrier material will cure to a substantially transparent solid solution forming the coating layer upon the solar panel surface, once sprayed thereon and optionally back-rolled with a nap roller. By substantially transparent is meant the coating layer transmits at least 90-99 percent of light through it to the underlying photovoltaic cells. Unless otherwise specifically defined herein, the use of the term substantially is meant as plus or minus five percent.

Currently, a preferred coating material mixture is formed as a reactive three component inorganic siloxane coating mixture which is blended and applied to the exposed surface of the clear glass or plastic panel covering the photovoltaic cells. The currently employed inorganic coating material mixture is composed of a first coating mixture component of an alkoxysilane mixture which substantially includes 2% by weight, of methyl alcohol or similar solvent, mixed with substantially 98% by weight of alkoxysilanes, of the total coating material mixture weight, such as that available from Adsil Corporation from Daytona Beach, Fla.

In a most preferred mode of the coating material mixture, which testing and experimentation have shown to both reduce the operating temperature, and, significantly reduce particulate adherence, the above noted first coating mixture component is combined with a second coating mixture component of acetic acid, and a third coating mixture component formed of assorted glycol ethers. The total coating mixture including this first coating component, and second coating component and third coating component, forms the entire volume of the inorganic coating mixture herein, including the alkoxysilane mixture disbursed therein. The coating mixture once cured to form a layer or substrate upon the transparent material covering the solar panel, yields a substantially transparent solid solution or layer, having the alkoxysilane mixture of the first component evenly disbursed therein.

However, it should be noted that those skilled in the art will of course may employ other second and/or third coating mixture components to form the cured layer of a solid solution coating herein. Such may be an inorganic polymer which will cure to a substantially transparent layer on the surface of the solar panel with the alkoxysilane mixture disbursed evenly therein in the formed solid solution, and such is anticipated. This is especially true with the advance in such polymeric materials which will last ten to twenty years in the sun.

Extensive testing and experimentation have shown the noted preferred second and third coating material components herein, when combined in the percentages by weight with the noted first coating material component, work well to yield a cured layer which provides temperature reduction and protection from particulate adherence. However, another carrier material such as an inorganic polymer or similar curable polymeric liquid, which will cure to a substantially transparent substrate on the solar panel, which will last for years, and which will position the alkoxysilane mixture evenly within the formed solid solution, is anticipated within the scope of this application.

The preferred solid solution cured coating material forming the layer, by weight of the total volume of the coating material mixture, which has been employed in successful testing on solar panels in multiple locations, includes three coating material components. The first coating material component is formed of an alkoxysilane mixture which is substantially 59-61% by weight, of the total inorganic coating mixture. Currently, as successfully used in testing and experimentation, this first component includes 98% alkoxysilanes mixed with 2 percent methyl alcohol, such as that available from the Adsil Corporation from Daytona Beach, Fla.

Operating temperature reduction of 10 degrees centigrade, as well as significant reduction of particulate adherence to the cured coating layer have been achieved, and as such it is preferred. However, varying the content of the first coating component by up to five percent may also provide improvement as to temperature and adherence and consequently the first coating component may be between 99-94% alkoxysilanes and 1-5% methyl alcohol. This first coating material component as noted, is included in the total volume of the inorganic coating material mixture herein, at substantially 59-61% by weight of the total weight of the volume of the mixture.

In the preferred mode of the resulting cured coating layer on solar panels as tested, also included in the total volume of the coating material mixture by weight, in combination with the first material coating component of the alkoxysilane mixture, the second coating material component, formed of acetic acid which is included at substantially 25-28% by weight of the total volume of the coating material mixture weight. The third coating material component of a currently preferred curable coating material mixture, is a glycol mix. This glycol mix is included at substantially 12-14% by weight of the total weight of the volume of coating material mixture blended.

By glycol mix herein is meant, one or a combination of glycol mixture components, from a group of glycol mixture components including, Isopropyl Alcohol, Glycol Ether PE (CAS 52125-53-8), glycol Ether PNP (CAS No. 1569-01-3) and EthyleneDiaminopropyl TriMethoxysilane (CAS No. 1760-24-3).

Currently, as used in testing, the favored glycol mix forming the third coating material component by weight of the volume of glycol mix itself, which is included in the coating mixture, is a mixture including by weight of the volume of glycol mix, substantially 34-36% Isopropyl Alcohol, substantially 28-32% Glycol Ether PE (CAS No. 52125-53-8), substantially 28-32% Glycol Ether PNP (CAS No. 1569-01-3) and substantially 2-3% EthyleneDiaminopropyl TriMethoxysilane (CAS No. 1760-24-3). However, this glycol mixture can vary and the glycol components could be substituted for others by one skilled in the art and such is anticipated within the scope of this patent.

Further, by the term substantially with regard to all the first, second, and third components included in the coating mixture, is meant plus or minus 3 percent from the noted preferred ranges included in the coating mixture and/or included in the individual components forming the coating mixture.

A current particularly favored coating mixture which was applied to solar panels in multiple locations for testing, and yielded the temperature reduction and particulate rejection, is formed where the total volume of the mixture includes by individual component weight, substantially 59.7% of the alkoxysilane mixture forming the first component, and 27% of acetic acid forming the second component; and 13.3% of the third component comprising the above noted currently favored glycol mix.

In the preferred method of application for existing solar panels, in a first step, the facing surface of the clear glass or plastic panel covering the underlying photovoltaic cells if needed, is cleaned with a solution such as water and a soap or other additive. In a second step, the clear panel is etched with an acidic etching solution. Currently, the acidic etching solution preferred is the application of a hydrochloric acid, which is wiped upon the clear glass or plastic panel and then dried or left to dry by evaporation.

In a next step, the three components of the inorganic coating mixture herein are mixed and left to sit in mixed form for 8-12 hours before it may be employed for application to the clear panel. The mixture is preferably applied by spraying it upon the exposed etched surface of the clear glass or plastic panel using a cone airless sprayer. An airless sprayer is preferable to avoid the inclusion of bubbles and the like in the spray.

In an optional step following the sprayed application of the coating material, it is back rolled with a nap roller. Back rolling consists of contacting the sprayed coating on the glass or plastic sheet of the solar panel, with a paint roller like a ¼" to ½" nap roller which is rolled upon the coating which was just sprayed. It was found during experimentation that while simply spraying the coating on the panel formed a cured coating layer thereon which reduced temperatures and inhibited particulate from sticking, a more even and better adherence of the cured layer of coating on the panel was achieved if the wet coating material was back-rolled immediately upon application. By immediately is meant within thirty minutes of application and less time where heat or sunlight speeds up the curing of the coating.

Subsequent to the step of back rolling with the roller, once the coating material mixture has cured or to form a solid solution layer on the exposed surface, it will operate to prevent the adherence of particulate to the clear panel such that dust, pollen, dirt, snow, to the clear panel exposed surface.

Further, while preventing particulate from attaching was an original object, as noted, it was unexpectedly found during experimentation and application of the coating material herein to solar panels, that the operating temperature of the underlying solar panel was reduced by 8-15% from an operating temperature of the solar panel before the coating is applied. This was a significant unexpected finding because temperature reduction will help solve one of the well-known problems in the operation of photovoltaic panels which is overheating due to excessive solar radiation and high ambient temperatures. Such overheating can reduce the efficiency of the solar panels dramatically.

Solar panels conventionally have operated best in a temperature range between 0° C. and 75° C. with 38° C. being noted in the industry, as an optimum operation temperature or lower. However, some solar panels may be designed to operate in lower and higher ranges. Common to all such solar panels is the problem that the electrical power output from such photovoltaic panels decreases as the photovoltaic cell temperature increases within the confines of the panel. It has been estimated that every 1° C. of temperature rise over an optimum operation temperature, will correspond to a drop in the efficiency and electrical power output by 0.5%. Consequently, lowering the peak operating temperature of such solar panels can affect the output of the solar panels significantly, especially when that operating Temperature is reaching the maximum.

As was found unexpectedly during experimentation with the coating material system herein, the operating temperature of the solar panels having the coating herein placed thereon was immediately lowered by about 8% to 12% (10 degrees C.) from the current operating temperature of un coated solar panels located immediately next to or proximate to coated solar panels. This was a significant decrease in temperature without loss of electrical output from the coated solar panels, and an actual gain in most cases, especially where the solar panels are located in high heat locales such as the desert.

Because, as noted, an over-temperature operation of even 1 degree centigrade can lower the power output of such solar panels, the unexpected lowered operation temperature yielded an increased electricity output of between 8-12% for the solar panel, with the higher increased output found in the solar panels operating in the hottest environment such as in the California desert. As such, the coating herein when cured forms a thermal reduction layer which lowered the operating temperature of all solar panels to which it is applied.

With respect to the above description, before explaining at least one preferred embodiment of the herein disclosed particulate adherence preventive and temperature lowering coating for photovoltaic solar panels system and method therefor in detail, it is to be understood that the invention is not limited in its application to the details of construction and to the arrangement of the steps in the following description or illustrated in the drawings. The invention herein described is capable of other embodiments and of being practiced and carried out in various ways which will become obvious to those skilled in the art on reading this disclosure. Also, it is to be understood that the phraseology and terminology employed herein are for the purpose of description and should not be regarded as limiting.

As such, those skilled in the art will appreciate that the conception upon which this disclosure is based may readily be utilized as a basis for designing of other particulate adherence and temperature reducing coating layers for photovoltaic solar panels for carrying out the several purposes of the present disclosed coating and method. It is important, therefore, that the claims be regarded as including such equivalent construction and methodology insofar as they do not depart from the spirit and scope of the present invention.

Further objectives of this invention will be brought out in the following part of the specification wherein detailed description is for the purpose of fully disclosing the invention without placing limitations thereon.

BRIEF DESCRIPTION OF DRAWING FIGURES

FIG. 1 shows the preferred contents of an inorganic coating in a first mode a) including in a percentage by weight of the entire volume of the mixed coating material, a first coating component comprising an alkoxysilane mixture including substantially 98 percent alkoxysilanes mixed with substantially 2 percent solvent; and a curable carrier material, and b) a particularly preferred mixture of three included coating material ingredients by percentage of total weight of the entire volume of the curable coating mixture, as tested.

FIG. 2 shows the method of coating solar panels to form the cured layer of inorganic coating mixture herein.

It should be noted the disclosed coating and the steps in the coating system may be reordered and that other aspects of the present invention shall be more readily understood when considered in conjunction with the accompanying drawings, and the following detailed description, neither of which should be considered limiting.

DETAILED DESCRIPTION OF THE
PREFERRED EMBODIMENTS OF THE
INVENTION

In this description, any directional prepositions if employed, such as up, upwardly, down, downwardly, front, back, top, upper, bottom, lower, left, right and other such terms refer to the device or depictions as such may be oriented are describing such as it appears in the drawings and are used for convenience only. Such terms of direction and location are not intended to be limiting or to imply that the device or method herein has to be used or positioned with graphics in any particular orientation.

As shown in FIG. 1, the coating mixture herein is an inorganic coating mixture or inorganic polymer having included at least a main component of the total volume of the mixture, comprising an alkoxysilane mixture, which is disbursed in the total volume of the curable coating mixture. The resulting coating mixture is applicable to the clear glass or plastic cover upon a solar panel and curable to form a layer thereon which is a solid solution of the curable material and the main coating component, or first component, of the alkoxysilane mixture.

As shown in FIG. 1 $a$) currently the preferred alkoxysilane mixture portion of the coating material, is combined into the coating mixture at a rate of 59-61% by weight of an alkoxysilane mixture, relative to the total weight of the total volume of the coating mixture having the carrier material therein, which is used to form the substantially transparent layer or substrate once cured upon the clear panel surface which covers the underlying photovoltaic components in the solar panel.

The currently employed alkoxysilane mixture portion, which is added to the total inorganic coating mixture at the rate of 59-61% by weight, includes 2% by weight of the volume of the alkoxysilane mixture of methyl alcohol or a similar solvent, combined with alkoxysilanes at 98% by weight of the alkoxysilane mixture. Mixed with a polymeric or other curable carrier liquid, this mode of the coating mixture will form a transparent inorganic cured coating layer upon the solar panel with the noted alkoxysilane mixture distributed substantially evenly throughout the area of the cured coating layer.

Shown in FIG. 1$b$) is a particularly preferred mode of the inorganic coating mixture herein which has been employed in testing and yielded the noted particle adherence reduction and the unexpected reduction in operating temperature of the solar panel to which the coating layer was applied.

As shown in 1$b$) of FIG. 1, a currently employed and preferred inorganic coating mixture, which will cure to form the layer upon a solar panel, is composed of:

a first coating component of an alkoxysilane mixture, which includes methyl alcohol or a similar solvent at 2% by weight of the total volume of the first component, combined with alkoxysilanes at 98% by weight of the total volume of the alkoxysilane mixture in the first coating component, where this first coating component comprises 59-61% by weight of the total weight of the volume of the coating mixture, and a second coating component formed of acetic acid which is included at substantially 25-28% by weight of the total volume of coating mixture; and a third component of a currently preferred coating mixture being a glycol mix, which is included at substantially 12-14% by weight, of the total weight of the blended coating mixture.

This preferred glycol mix currently includes by weight of the volume of glycol mix in the third component, of substantially 34-36% Isopropyl Alcohol, substantially 28-32% Glycol Ether PE (CAS No. 52125-53-8), substantially 28-32% Glycol Ether PNP (CAS No. 1569-01-3) and substantially 2-3% EthyleneDiaminopropyl TriMethoxysilane (CAS No. 1760-24-3). However, as noted it is anticipated this glycol mixture can vary and the glycol components could be substituted for others by one skilled in the art and such is anticipated within the scope of this patent.

In FIG. 2 is shown the steps in the method of application of the coating mixture herein, for existing solar panels. As shown in a first step 12, the clear glass or plastic panel covering the underlying photovoltaic cell if needed is cleaned with a solution such as water and a soap or other additive. In a second step 14 the clear panel is etched with an etching solution such as with the application of a hydrochloric acid, which is wiped upon the clear glass or plastic panel and then dried or left to dry by evaporation.

In a third step 16 shown in FIG. 2, once the clear panels covering the photovoltaic cells have been cleaned and etched, the inorganic coating mixture herein, which has been mixed and left for 8-12 hours prior to application, is then applied by spraying it upon the exposed etched surface of the clear glass or plastic panel, preferably using a cone airless sprayer.

In a subsequent step in the method 18, following the sprayed application of the coating material, the material prior to curing while located on the clear panel covering the photovoltaic cells, is back rolled with a nap roller, this step may be included or excluded but better and more even coverage was found by including it.

In a further step 20, subsequent to the step of spraying the material and/or back rolling the sprayed coating material with the roller, the coating is allowed to cure to a thin even substrate or layer.

While all of the fundamental characteristics and features of the solar panel coating system and method herein have been shown and described herein, with reference to particular embodiments thereof, a latitude of modification, various changes and substitutions are intended in the foregoing disclosure and it will be apparent that in some instances, some features of the invention may be employed without a corresponding use of other features without departing from the scope of the invention as set forth. It should also be understood that upon reading this disclosure and becoming aware of the disclosed novel and useful system, various substitutions, modifications, and variations may occur to and be made by those skilled in the art without departing from the spirit or scope of the invention. Consequently, all such modifications and variations and substitutions, as would occur to those skilled in the art are considered included within the scope of the invention as defined by the following claims.

What is claimed is:

1. A method for the application of an inorganic siloxane coating mixture which includes a first coating component comprising an alkoxysilane mixture, said alkoxysilane mixture portion comprising 2% methyl alcohol and 98% alkoxysilanes, said alkoxysilane mixture portion comprising 59-61% by weight of a weight of a total volume of said coating mixture;

a second coating component formed of acetic acid which is included at substantially 25-28% by weight, of the weight of the total volume of coating mixture;

and a third component comprising a glycol mix having a mixture of glycol ethers and other components, included at substantially 12-14% by weight, of the weight of the total volume of coating mixture, to the transparent sheet material covering a photovoltaic of a solar panel;

comprising the steps of:

mixing a volume of said inorganic siloxane coating material from respective portions of said first component, said second component, and said third component;

cleaning the transparent sheet material;

etching an exposed surface of said transparent sheet of material;

spraying the inorganic siloxane coating upon said exposed surface;

subsequent to spraying the inorganic siloxane coating upon said exposed surface, employing a roller to back-roll said inorganic siloxane coating prior to allowing it to cure; and allowing said inorganic siloxane coating to cure upon said exposed surface to form said protective layer thereon.

2. The method for the application of the inorganic siloxane coating mixture of claim 1, including the additional step of:

leaving said volume of said inorganic siloxane coating material to sit for 8-12 hours prior to performing the step of spraying the inorganic siloxane coating upon said exposed surface.

\* \* \* \* \*